US010910822B2

(12) United States Patent
Ramachandran et al.

(10) Patent No.: US 10,910,822 B2
(45) Date of Patent: Feb. 2, 2021

(54) CONTROL OF A POWER TRANSISTOR WITH A DRIVE CIRCUIT

(71) Applicant: TEXAS INSTRUMENTS INCORPORATED, Dallas, TX (US)

(72) Inventors: Bhaskar Ramachandran, Coimbatore (IN); Dattatreya Baragur Suryanarayana, Bengaluru (IN); Vishal Gupta, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/503,113

(22) Filed: Jul. 3, 2019

(65) Prior Publication Data
US 2020/0014192 A1   Jan. 9, 2020

(30) Foreign Application Priority Data

Jul. 6, 2018  (IN) .............................. 201841025235
Jul. 6, 2018  (IN) .............................. 201841025248

(51) Int. Cl.
*H02H 3/38* (2006.01)
*H02M 3/07* (2006.01)
*H02J 7/34* (2006.01)
*G01R 19/165* (2006.01)

(52) U.S. Cl.
CPC ......... *H02H 3/38* (2013.01); *G01R 19/16519* (2013.01); *H02J 7/345* (2013.01); *H02M 3/07* (2013.01)

(58) Field of Classification Search
None
See application file for complete search history.

(56) References Cited

U.S. PATENT DOCUMENTS

| 7,826,238 B2 * | 11/2010 | Halamik | H01L 27/098 363/49 |
| 2011/0134674 A1 * | 6/2011 | Ivanov | H02M 7/219 363/127 |
| 2014/0347078 A1 * | 11/2014 | Qin | G01R 19/0092 324/713 |
| 2017/0343589 A1 * | 11/2017 | Mukherjee | H03D 1/229 |
| 2018/0219482 A1 * | 8/2018 | You | G01R 35/005 |

\* cited by examiner

*Primary Examiner* — Lincoln D Donovan
*Assistant Examiner* — Khareem E Almo
(74) *Attorney, Agent, or Firm* — Michael A. Davis, Jr.; Charles A. Brill; Frank D. Cimino

(57) ABSTRACT

A system includes a first transistor having a first control input and first and second current terminals. The first current terminal couples to an input voltage node. A second transistor has a second control input and third and fourth current terminals. The third current terminal couples to the second current terminal at a first node. The fourth current terminal couples to an output voltage node. A drive circuit is configured to charge a capacitor maintain the first transistor in an off state responsive to a negative voltage on the input voltage node, and, responsive to a negative voltage on the input voltage node, to cause the charge from the capacitor to be used to turn off the first transistor. The system provides a voltage to a load coupled to the output voltage node.

18 Claims, 10 Drawing Sheets

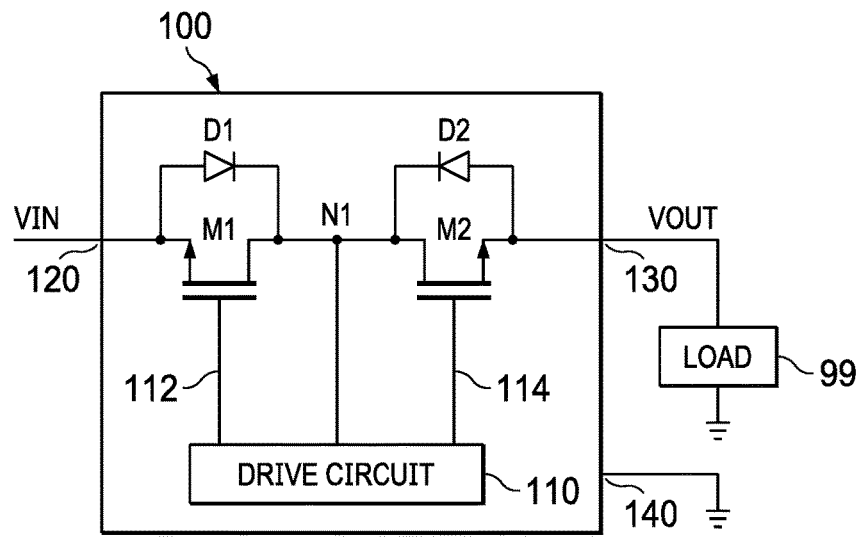
FIG. 1
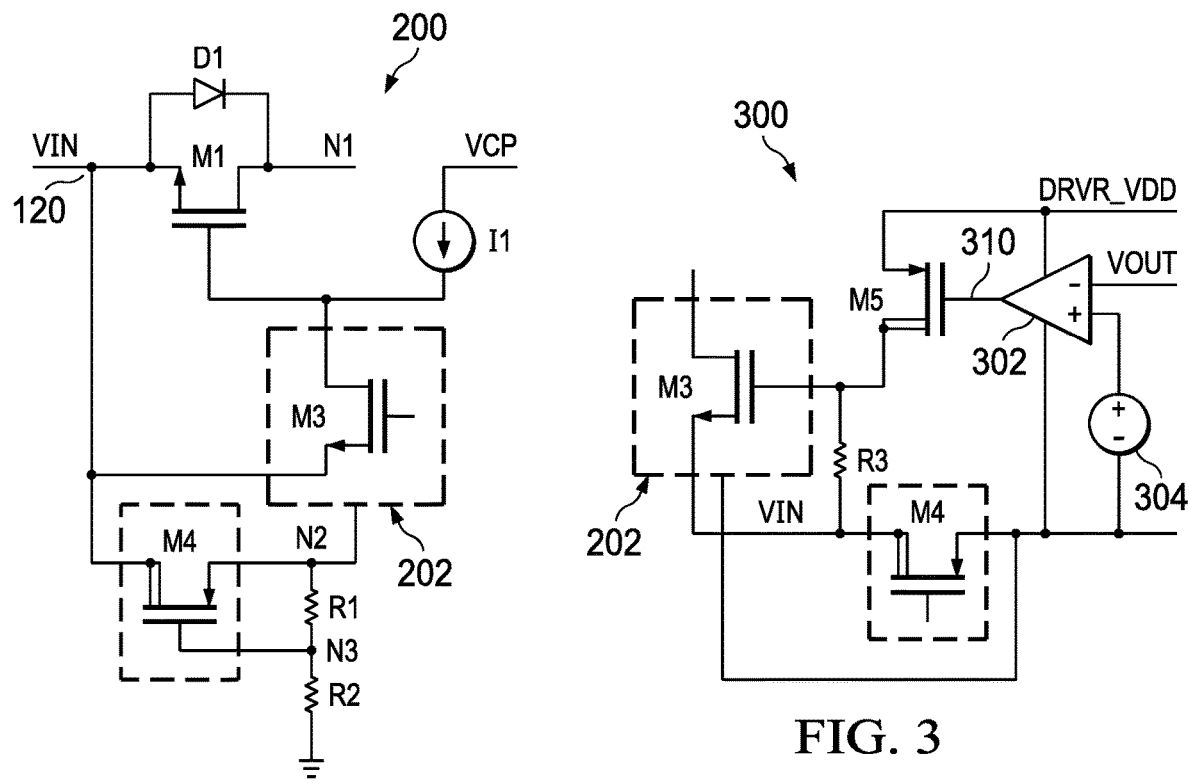
FIG. 2A
FIG. 3

CONTROL OF A POWER TRANSISTOR WITH A DRIVE CIRCUIT

CROSS-REFERENCE TO RELATIONED APPLICATIONS

This application claims priority to India Provisional Application Nos. 201841025235 and 201841025248, filed Jul. 6, 2018, which is hereby incorporated by reference.

BACKGROUND

In some applications (e.g., industrial applications), an "E-fuse" switch is included in the power path between a power source and a downstream load. The E-fuse switch protects the load against over-voltage and over-current events.

SUMMARY

In one example, a circuit includes a first transistor having a first control input and first and second current terminals. The first current terminal is coupled to an input voltage node. A second transistor has a second control input and third and fourth current terminals. The third current terminal is coupled to the second current terminal at a first node. The fourth current terminal is coupled to an output voltage node. A third transistor has a third control input and fifth and sixth current terminals. The fifth current terminal is coupled to the first control input. The sixth current terminal is coupled to the first current terminal. A comparator has first and second comparator inputs. The first comparator input is coupled to the output voltage node. The second comparator input is coupled to a bias voltage node configured to be biased at a voltage greater than an input voltage on the input voltage node. The comparator has an output configured to control a power state of the third transistor.

BRIEF DESCRIPTION OF THE DRAWINGS

For a detailed description of various examples, reference will now be made to the accompanying drawings in which:

FIG. 1 illustrates an example integrated circuit.

FIG. 2A shows an example circuit for turning off a first transistor during a power glitch.

FIG. 3 shows an example circuit for driving a second transistor to turn off the first transistor during the power glitch.

DETAILED DESCRIPTION

Figure 2B:
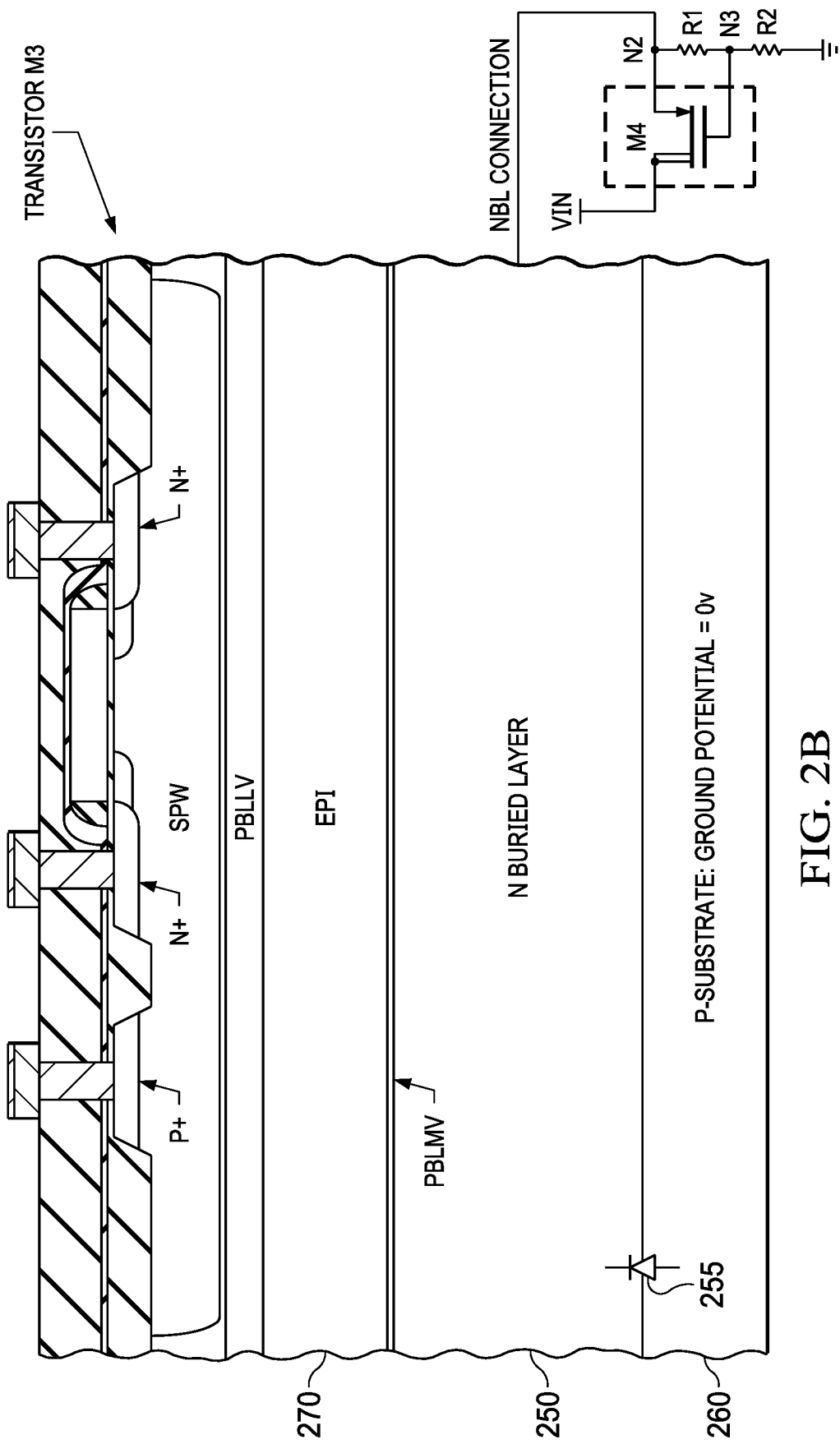
FIG. 2B shows a cross-section of transistor including an N-doped buried layer (NBL).

As described herein, an E-fuse switch protects loads against power supply perturbations. One such perturbation is a large negative voltage transient on the power supply voltage to the E-fuse switch. Large negative voltage transients can occur due to, for example, power surges and reverse polarity events. During large negative voltage transients, reverse current is limited (e.g., stopped) from the output port of the E-fuse switch to its input port. The described E-fuse switch rapidly detects a reverse current or negative input voltage and turns off a solid-state switch contained in the E-fuse switch to thereby protect the load connected thereto.

FIG. 1 shows an example of an integrated circuit (IC) 100. In one example implementation, IC 100 is an E-fuse switch. IC 100 in this example comprises transistors M1 and M2 and drive circuit 110. Transistors M1 and M2 comprise n-type metal oxide semiconductor field effect transistors (NMOS). The body diode of the transistors M1 and M3 also are shown. Body diode D1 is shown between the source and drain of transistor M1, and body diode D2 is shown between the source and drain of transistor M2. Drive circuit 110 generates control signals 112 and 114 for driving the gates of transistors M1 and M2, respectively. Drive circuit 110 controls the gate-to-source voltage (Vgs) of transistor M2 to limit current to/from the load as necessary, and operates transistor M1 as a switch to turn it off upon detection of a negative VIN. The IC 100 has an input terminal 120 configured to receive an input supply voltage (VIN), and an output terminal 130 to provide an output voltage (VOUT) to a downstream load.

When VIN is provided to the IC 100 and transistors M1 and M2 are both on as controlled by the drive circuit 110, VOUT is generally equal to VIN. If an anomalous condition (e.g., negative VIN) is detected by drive circuit 110, the drive circuit 110 turns of transistor M1 to protect the load. In one example, IC 100 is rated for an input voltage VIN being between 4 and 36 volts. As such, the output voltage VOUT also is between 4 and 36 volts. In accordance with the described examples, in response to drive circuit 110 detecting a negative VIN voltage, the drive circuit 110 turns off transistor M1.

Reference 140 shows that the substrate of the IC 100 is grounded. Because the substrate is grounded, the drive circuit 110 as described herein is operative to turn off transistor M1 responsive to a negative input voltage VIN. In some implementations, the IC 100 can turn off transistor M1 with a negative VIN as low as, for example, −60 V. Further, VIN can slew downward at very high rates during some surge events (e.g., during lightning strikes to equipment or buildings containing equipment that includes the IC 100) and the disclosed drive circuit 110 is configured to provide fast detection to VIN falling below larger negative voltages, such that the disclosed drive circuit 110 may turn off transistor M1 to avoid the gate-to-drain capacitance (Cgd) and gate-to-source capacitance (Cgs) of transistors M1 and M2 from creating a high shoot-through current path through the transistors, which could damage the transistors. A shoot-through current path can be created by voltage division caused by the transistor's parasitic capacitances if VIN were to slew at a high rate. The disclosed drive circuit 110 also is configured to provide a relatively high drive strength to turn off transistor M1 rapidly. In one example, if the slew rate of VIN is 60 V/microsecond, and Cgd of transistor M1 is 1 nF, then the gate current will be equal to Cgd*dv/dt=60 mA. The pull-down resistance on the gate of transistor M1 should be small enough to avoid creating so large of a gate voltage that transistor M1 will not turn off. In this example, a drive strength for the gate of transistor M1 of 5 ohms or less would be sufficient. Further, situations may occur in which no active input voltage VIN is provided to the input terminal 120, but the voltage on the input terminal 120 is negative anyway (e.g., due to a lightning strike). In such a condition, the drive circuit 110 advantageously ensures that the current path through transistors M1 and M2 is continuously off despite not having a positive supply voltage VIN to control the components of the drive circuit 110.

Figure 6:
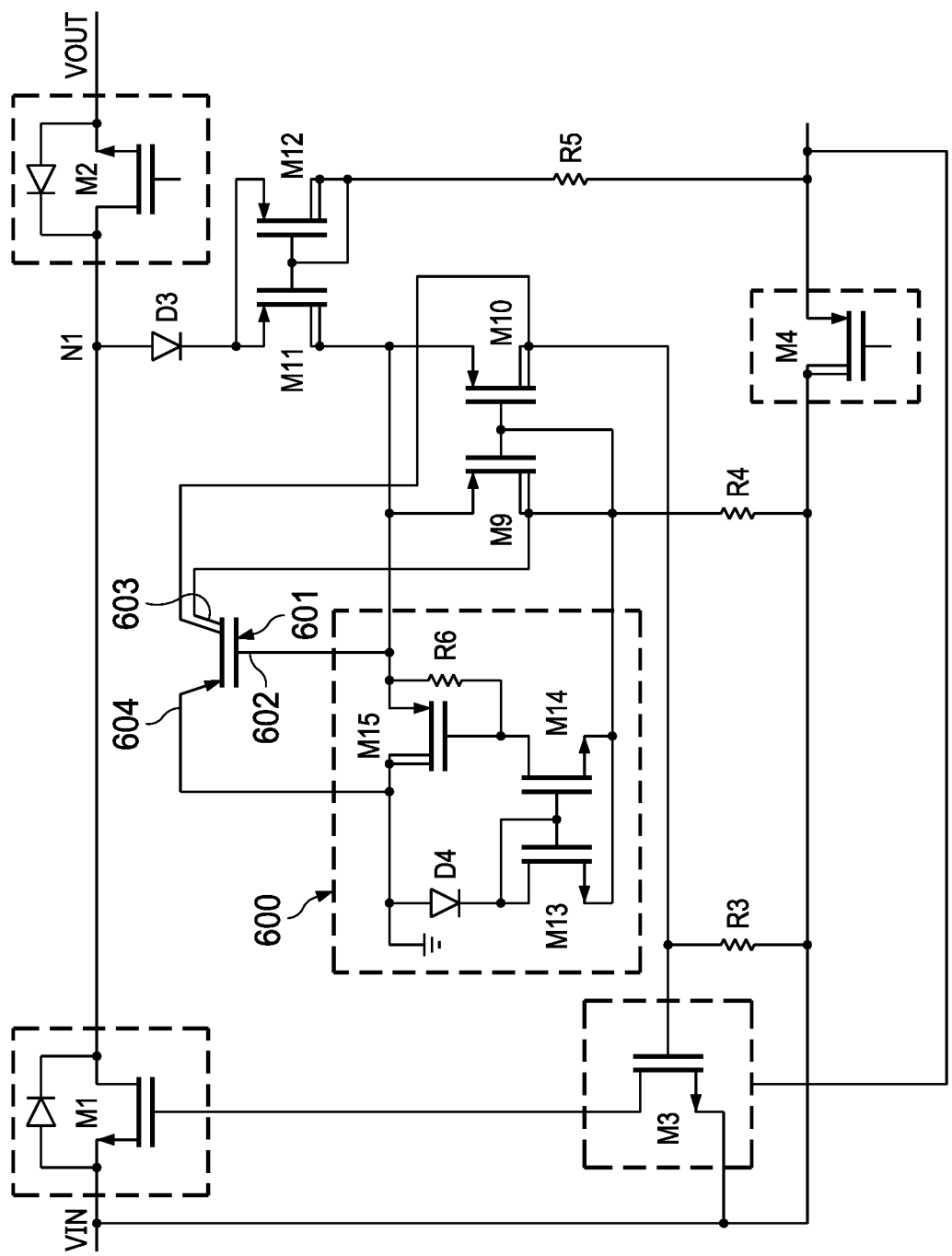
FIG. 6 shows an example circuit usable in the integrated circuit of FIG. 1.
Figure 7:
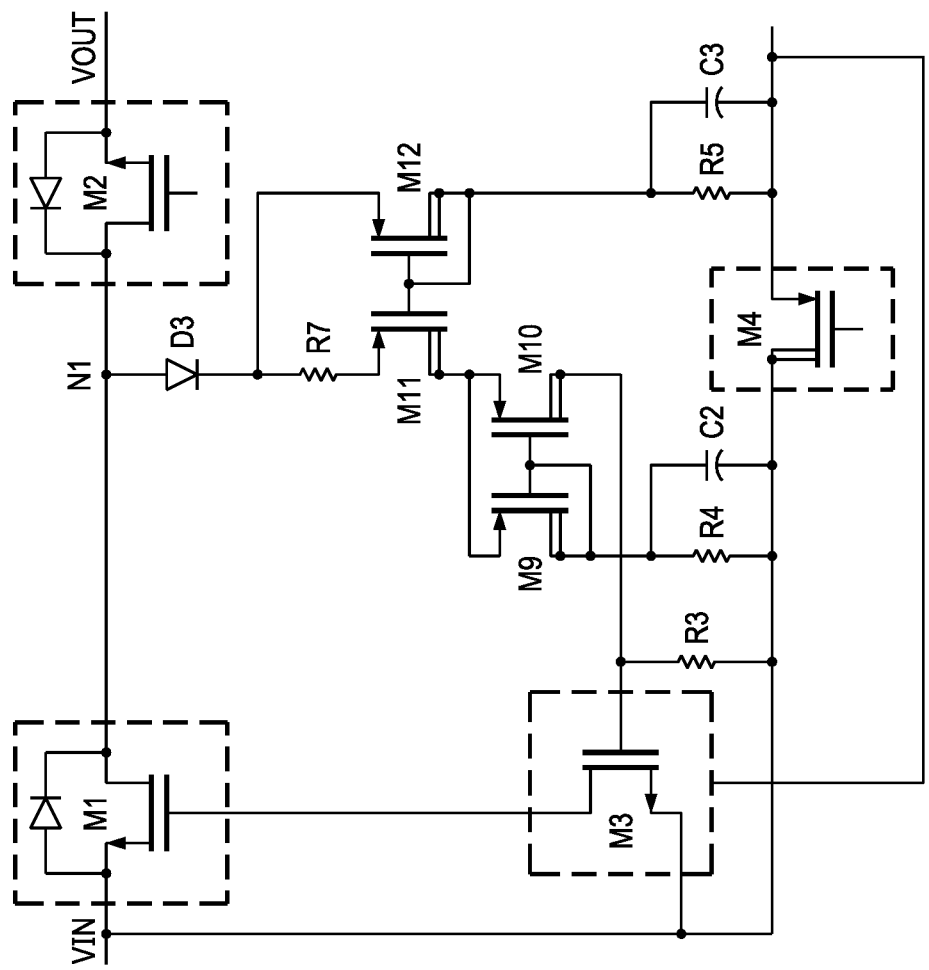
FIG. 7 shows an example circuit to drive the second transistor when an input supply voltage had not been enabled to the integrated circuit.
Figure 8:
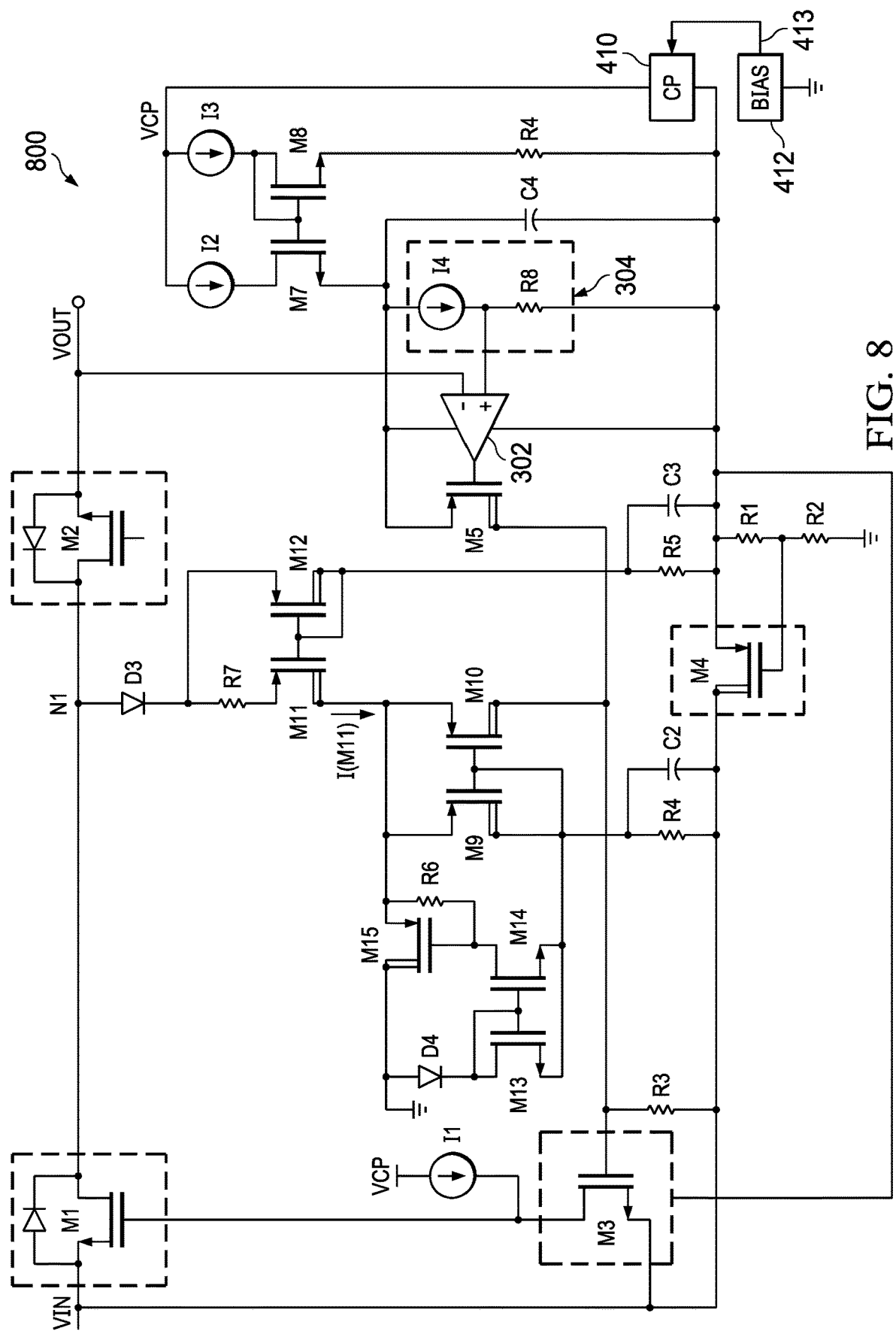
FIG. 8 shows a schematic including the components of FIGS. 2-7.

FIGS. 2A through 7 illustrate at least portions of the drive circuit 110 and FIG. 8 combines the circuits of FIGS. 2A-7 into one complete schematic. FIG. 2A shows an example gate control circuit 200. The example gate control circuit 200 comprises transistor M1 as well as transistors M3 and M4, resistors R1 and R2, and current source device I1. Transistor M3 in this example comprises an NMOS device and transistor M4 comprises a drain-extended p-type metal oxide semiconductor field effect transistor (PMOS). The drain of transistor M3 connects to the gate of transistor M1 and to current source I1. The source of transistor M3 connects to the source of transistor M1, and to the drain of transistor M4 to receive VIN. Resistors R1 and R2 are connected in series between an N-doped buried layer 202 of transistor M3 and ground. FIG. 2B shows a cross-section of transistor M3. The N-doped buried layer (NBL) 250 is shown formed on a P-doped substrate 260 (M3's source). Because the substrate 260 is P-doped and the NBL is N-doped, a parasitic diode 255 is formed. The connection point between resistors R1 and R2 is labeled node N3 and is connected to the gate of transistor M4. The N-doped buried layer 202 and resistor R1 are also connected to the source of transistor M4 (node N2). The voltage on the N-doped buried layer 202 should not become negative because otherwise the parasitic diode 255 will turn on and conduct current. FIG. 2B also shows an epitaxial (epi) layer 270. The epi layer 270 is p-doped in this example and is a local substrate to transistor M3. The epi layer 270 can be connected to ground or to the source of transistor M3.

During normal operation, transistor M1 is on and the positive input voltage VIN is provided through transistor M1 onto node N1. As the drain and source of transistor M3 are connected across the gate and source of transistor M1, turning on transistor M3 forces the Vgs of transistor M1 to be approximately 0V and thus less than the threshold voltage of transistor M1, thereby turning off transistor M1. With transistor M3 off, transistor M1 is caused to be on due to current from current source I1. Advantageously, gate control circuit 200 turns off transistor M1 responsive, as explained below, to VIN being a negative voltage.

Transistor M4 and resistors R1 and R2 protect internal circuits of the IC 100 from VIN in the situation in which VIN is a negative voltage. When VIN is positive, the body diode of transistor M4 brings the voltage on node N2 to a positive voltage within one diode voltage drop of VIN. The series-connected resistors R1 and R2 provide a voltage on node N3 that is lower than the voltage on node N2. Node N3 is connected to the gate of transistor M4, and thus the Vgs of transistor M4 is sufficient to turn on transistor M4 when VIN is positive. When VIN is negative, the body diode of transistor M4 is reverse biased and the voltage on node N2 is zero, which in turn forces off transistor M4 thereby protecting internal circuits from a negative VIN.

FIG. 3 shows an example of a negative input voltage detection circuit 300 for driving the gate of transistor M3. Transistor M3 is shown in both FIGS. 2 and 3. The example negative input voltage detection circuit 300 shown in FIG. 3 includes a comparator 302, a bias voltage source 304, transistors M4 and M5, and resistor R3. Resistor R3 is connected between the gate and source of transistor M3. Transistor M5 is a PMOS transistor whose drain is connected to resistor R3 and whose source is connected to an internally-generated supply voltage labeled DRVR_VDD (described below). The internally-generated supply voltage DRVR_VDD operates comparator 302. The negative input of the comparator 302 receives the output voltage VOUT and the positive input to comparator 302 receives the input voltage VIN plus the bias voltage from bias voltage source 304. The voltage of the bias voltage source 304 is relatively low and just needs to be large enough to determine accurately whether VIN is less than VOUT, which would happen if VIN becomes negative (VOUT does not fall below 0V). In one example, the voltage of bias voltage source 304 is 15 mV.

Under normal conditions (when VIN is positive), VOUT equals VIN, and due to the voltage of bias voltage source 304, the positive input to comparator 302 is larger than VOUT on the negative input to comparator 302. As such, the output of the comparator is high thereby turning off transistor M5. With transistor M5 off, no current flows through resistor R3, and thus the Vgs of transistor M3 is zero thereby maintaining transistor M3 in an off condition (and transistor M1 on). If the input voltage VIN becomes negative, the output of comparator 302 will be low enough to turn on transistor M5 which causes current to flow from the internally-generated supply voltage node DRVR_VDD, through transistor M5 and resistor R3, thereby generating a sufficiently large Vgs for transistor M3 to turn. As explained above, turning on transistor M3 causes transistor M1 to turn off. Advantageously, negative input voltage detection circuit 300 causes transistor M3 to turn on responsive VIN being negative.

Figure 4:
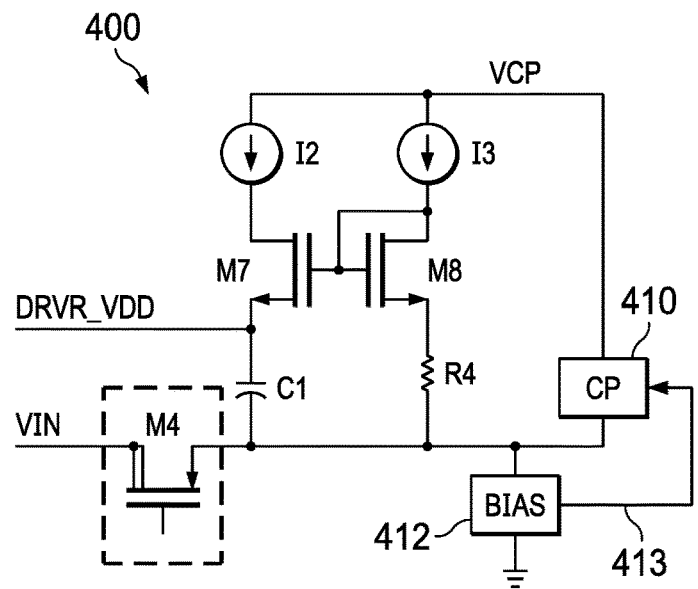
FIG. 4 shows an example circuit for generating an internal voltage supply rail.

The input voltage VIN can slew downward at a relatively high rate during a surge event. As such, transistor M1 should be turned off quickly to avoid damage to internal components of the IC 100 and the load. FIG. 4 shows an example charge storage circuit 400 including a charge pump 410 to maintain a capacitor C1 in a charged state. The charge on the capacitor C1 can be used to drive the voltage rail DRVR_VDD to power the comparator 302 of FIG. 3 and turn on transistor M5 despite VIN rapidly falling to negative voltage levels.

The example charge storage circuit 400 includes transistors M7 and M8 (both NMOS transistors in this example), current source devices I2 and I3, capacitor C1, resistor R4, bias voltage generator 412, and a charge pump 410. The source of transistor M4 is connected to one input of charge pump 410 and to bias voltage generator 412. The bias voltage generator 412 generates a bias voltage 413 using the input voltage VIN and provides the bias voltage 413 to the charge pump 410. The output of charge pump 410 provides voltage to the voltage rail VCP, which connects to current source device is I2 and I3. The drain of transistor M7 is connected to the current source device I2, and the drain of transistor M8 is connected to current source device I3. The gates of transistors M7 and M8 are connected together and to the drain of transistor M8. The source of transistor M7 is connected to one plate of capacitor C1, and the source of transistor M8 is connected to resistor R4. The other terminals of capacitor C1 and R4 are connected together and to the source of transistor M4, the bias voltage generator 412, and charge pump 410. The voltage rail DRVR_VDD is taken from the node interconnecting the source of transistor and M7 and capacitor C1 as shown.

The function of negative input voltage detection circuit 300 in FIG. 3 is to turn on transistor M3 and to do so rapidly. To turn on transistor M3 rapidly, a sufficient amount of charge should be transferred to the gate of transistor M3. Advantageously, the charge storage circuit 400 in FIG. 4 is operative to charge capacitor C1 when VIN is positive, and then to transfer the charge from capacitor C1 via the DRVR_VDD internally-generated supply rail to the source of transistor M5 in FIG. 3 to thereby provide significant drive current to transistor M3 to turn on transistor M3 quickly. In one example, charge pump 410 generates a voltage on supply rail VCP that is 12V higher than VIN. Based on the size of resistor R4, a voltage is developed across resistor R4 that is, in one example, 5 V. Transistors M7 and M8 form a current mirror, and as a result, a similar voltage (e.g. 5 V) is formed across capacitor C1. As such, the internally-generated supply voltage rail DRVR_VDD is, in one example, 5 V, and charge from capacitor C1 can be quickly delivered to the gate of transistor M3 to turn on transistor M3 when needed. The capacitance of capacitor C1 is large enough to provide sufficient charge to charge the gate of transistor M3 to turn it on quickly. In one example, C1 is a 150 pF capacitor.

The charge storage circuit 400 of FIG. 4 is operative to pre-charge capacitor C1 when a positive input voltage VN is present. However, it is also possible that a positive input voltage VIN has not yet been provided to the IC 100. If a positive input voltage has not yet been provided to IC 100, then it would not be possible to have capacitor C1 in a pre-charged state. During such a condition (capacitor C1 is not pre-charged), it is also possible to have a negative voltage surge event in which VIN is forced to lower and lower negative voltages.

Figure 5:
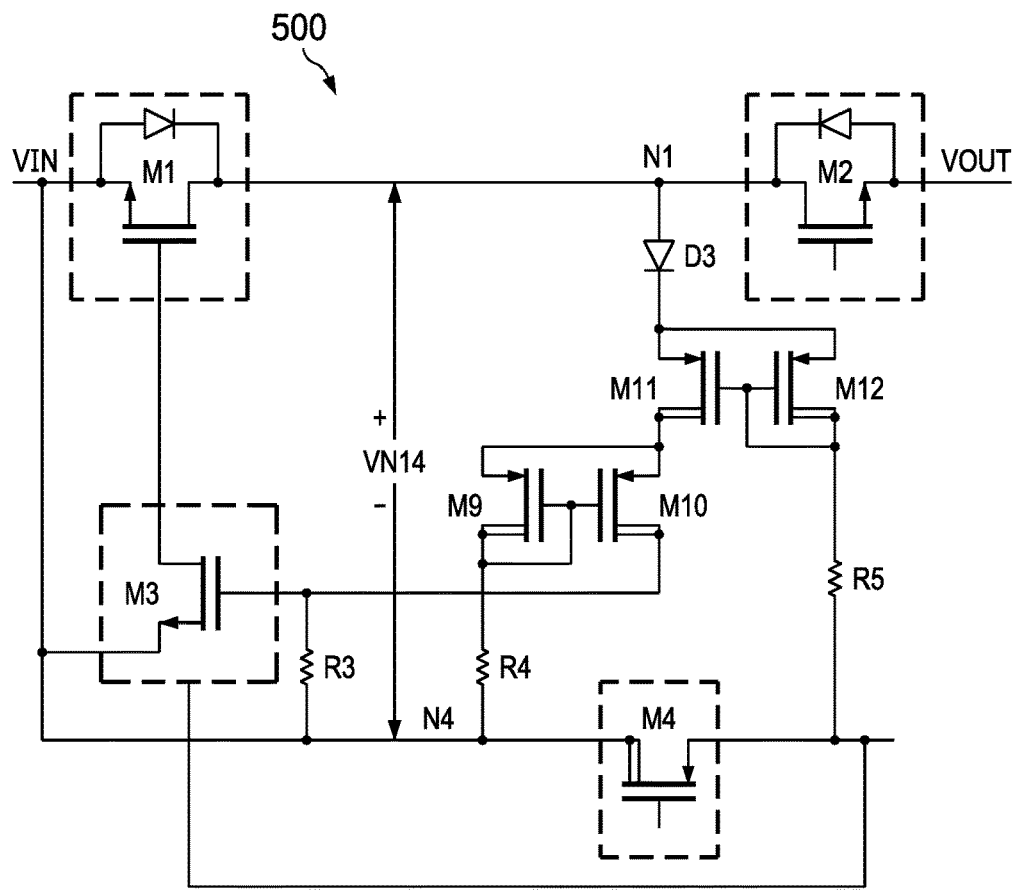
FIG. 5 shows an example circuit for driving the second transistor when an input supply voltage had not been enabled to the integrated circuit.

FIG. 5 shows an example of a negative voltage circuit 500 that is operative to turn on transistor M3 thereby turning off transistor M1 when VIN was not positive in the first place to have pre-charged capacitor C1. In the example of FIG. 5, negative voltage circuit 500 comprises resistors R3, R4, and R5, diode D3, and transistors M9, M10, M11, and M12. Transistors M9-M12 comprise PMOS transistors in this example. Transistors M9 and M10 are coupled together to form one current mirror, and transistors M11 and M12 are coupled together to form another current mirror. Resistor R3 connects between the gate of transistor M3 and VIN. The anode of diode D3 is connected to node N1, and the cathode of diode D3 is connected to the sources of transistors M11 and M12. The gates of transistors M11 and M12 are connected together as well as to the drain of transistor M12. The drain of transistor M12 also connects to resistor R5, and the other terminal of resistor R5 connects to the source of transistor M4. The drain of transistor M11 connects to the sources of transistors M9 and M10. The gates of transistors M9 and M10 are connected together and to the drain of transistor M9. The drain of transistor M9 is also connected to resistor R4, and the other terminal of resistor R4 is connected to the drain of M4 and to resistor R3 at node N4.

A load circuit will often have either or both of a load capacitor or a combination of a diode and a resistor connected between VOUT and ground. As a result, VOUT will not fall below zero. This means that if there is no input voltage VN, VOUT will be 0 V, and if VIN happens to become negative, VOUT will remain at 0V. Due to the output capacitor associated with the load, however, VOUT could be slightly positive even if there is no input voltage VIN. If VOUT is 0 V or slightly positive, the voltage on node N1 will also be 0V (or slightly positive) when M2 is on. If VIN becomes a negative voltage, the voltage on node N4 will be negative because node N4 is at the same potential as VIN. Thus, a positive voltage will be present on node N1 relative to node N4. This positive voltage (illustrated in FIG. 5 as VN14) can be used to produce a current through the diode D3, transistor M11, and transistors M9 and resistor R4 to node N4. The current through transistor M9 is controlled, at least in part, by the resistance of resistor R4. The current mirror ratio between transistors M9 and M10 is 1:1 (but can be other than 1:1), and thus the current through transistor M10 is equal to the current through transistor M9. The current through transistor M9 flows through resistor R3 to node 4. Resistor R3 is connected between the gate and source of transistor M3, and thus any voltage that is developed across resistor R3 is the Vgs of transistor M3. The resistance values for resistors R3 and R4 are chosen such that the resulting voltage developed across resistor R3 (the Vgs of transistor M3) is sufficiently high to exceed the threshold voltage of transistor M3. As a result, when VIN becomes negative, even if capacitor C1 was never charged, transistor M3 can still be turned on to thereby turn off transistor M1. Advantageously, negative voltage circuit 500 is operative to turn on transistor M3 when VIN is negative even if capacitor C1 was not able to be charged.

FIG. 6 shows a circuit similar to that of FIG. 5, but includes an additional parasitic control circuit 600. Parasitic control circuit 600 is connected to the ground node and is operative to also try to force a current through transistor M9 to turn on transistor M3. Parasitic control circuit 600 includes a diode D4, resistor R6, and transistors M13, M14, and M15. The anode of diode D4 is connected to the ground node, and the cathode of the diode D4 is connected to the drain of transistor M13 and the gates of transistors M13 and M14. The sources of transistors M13 and M14 are connected together and to the drain of transistor M9. The drain of transistor M15 also is connected to ground and to the anode of diode D4. Resistor R6 is connected between the source and gate of transistor M15, as well as to the drain of transistor M14.

If VIN becomes negative, the body diode of transistor M15 turns on, and a voltage one diode voltage drop below ground is imposed on the sources of transistors M9 and M10. Circuit 600 senses the drain-to-source voltage (Vds) of transistor M9, and by causing current to flow through transistor M9 also causes a current to flow into resistor R3. Transistors M9 and M10 have PNP parasitics, as illustrated at 601. The N-doped buried layers of transistors M9 and M10 are represented by 602 and are connected to the drain of transistor M15. The P-doped drains of transistors M9 and M10 are represented by 603. Reference numeral 604 represents the P-doped substrate of transistor M9 and M10. If the sources of transistors M9 and M10 fall below −0.7 V, the PNP parasitics (601) of the transistors will start to conduct current possibly leading to an uncontrolled current injection into the gate of transistor M3, which could then lead to a voltage on the gate of transistor M3 sufficiently high to destroy the gate oxide of that transistor. Advantageously, parasitic control circuit 600 ensures that the PNP diode parasitics of transistors M9 and M10 do not turn on. Turning on the PNP parasitics of M9 and M10 could lead to uncontrolled current injection into resistor R3, which would lead to a high gate voltage on the gate of the transistor M3 and destroy the gate of oxide of transistor M3.

FIG. 7 shows a modification to the negative voltage circuit 500 circuit of FIG. 5. The modification includes resistor R7 and capacitors C2 and C3. Resistor R7 degenerates the source of transistor M11 to cause transistor M11 to provide a prescribed amount of current. The current into resistor R3 is the minimum of the drain current through transistor M11 and the drain current through transistor M9. If the drain current through transistor M9 is smaller than the drain current through transistor M11, the smaller drain current through transistor M9 is the current that flows into resistor R3. The voltage on the source of transistor M9 is increased as a result to limit the VDS of transistor M11. Capacitor C2 is connected in parallel across resistor R4, and capacitor C3 is connected in parallel across resistor R5. The resistors R4 and R5 are thus shunted by their respective capacitors in the event of a fast transient. In one example, resistor R3, R4, and R5 have resistances of 133 kilo-ohms, 6 megaohms, and 4 mega-ohms, respectively. Advantageously, the modified negative voltage circuit of FIG. 7 is operative to turn on transistor M3 when VIN is negative even if capacitor C1 was not able to be charged.

FIG. 8 shows a drive circuit 800 comprising several features of the circuits of FIGS. 2-7 in one schematic. As such, a description of the components shown in FIG. 8 is not repeated here. The bias voltage source 304 of FIG. 3 is shown in the example circuit of FIG. 8 as a current source device I4 connected to resistor R8. A fixed current from the current source device I4 causes a voltage to be generated across resistor R8. The voltage across resistor R8 represents the bias voltage provided to the positive input of the comparator 302. The drive circuit 800 if FIG. 8 advantageously turns off transistor M1 responsive at least to VIN being a negative voltage.

Figure 9:
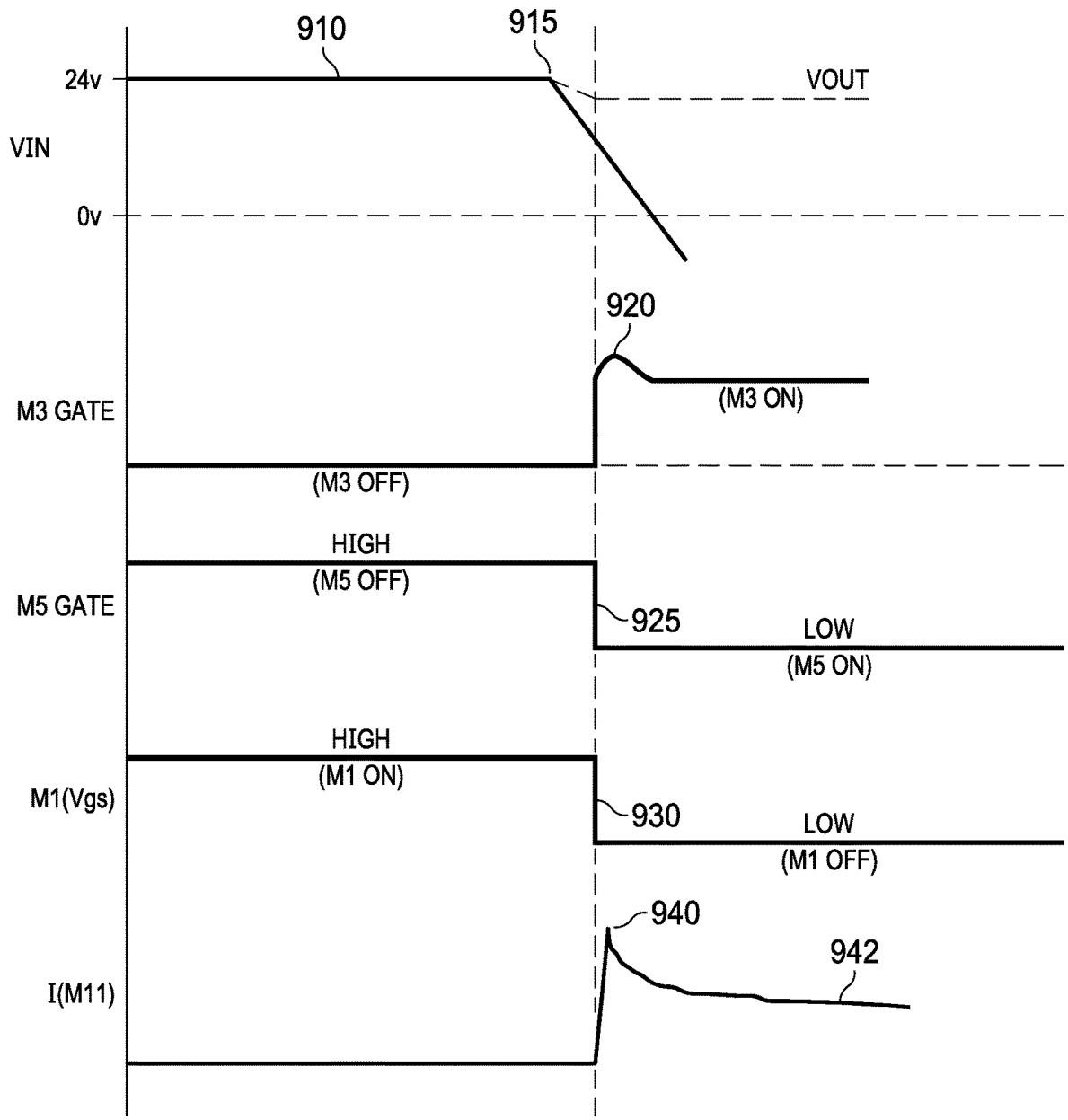
FIG. 9 shows an example timing diagram.

FIG. 9 provides an example timing diagram illustrating the operation of the circuit of FIG. 8. The waveforms shown in FIG. 9 include VIN, the gate voltage of transistor M3, the gate voltage of transistor M5, the Vgs of M1, and the drain current through transistor M11, I(M11). At 910, VIN is above 0 (e.g., positive 24 V), and VOUT is equal to VIN. The gate voltage of transistor M5 is high because the positive input to comparator 302 is larger than the negative input to comparator 302. With the M5 gate voltage being high, M5 (which is a PMOS device) will be off, and thus the gate of transistor M3 will be low and transistor M3 will be off as well. With transistor M3 off, the Vgs of transistor M1 will be high enough to keep transistor M1 on.

FIG. 9 illustrates the reaction to the circuit when VIN drops quickly, as shown at 915. A sudden drop in VIN may result in VIN being lower than VOUT, which does not drop as quickly. The difference in the voltages of VIN and VOUT causes the output of comparator to become low (925) thereby causing transistor M5 to turn on. With transistor M5 on, current flows through resistor R3, thereby developing a sufficiently large gate voltage (920) across transistor M3 to turn on transistor M3. With transistor M3 on, the Vgs of transistor M1 becomes low thereby turning off transistor M1 at 930. Current I(M11) represents the drain current through transistor M11, and the current through resistor R3 as explained above. When VIN drops rapidly, I(M11) increases rapidly as shown at 940 thereby rapidly turning on transistor M3 before I(M11) settles at its DC value at 942.

As noted above, while VOUT does not drop below 0V, it is possible that VIN becomes negative. In fact, VIN could have a large negative voltage (e.g., −60V). VOUT, in one example, could be 36V. If VOUT is 36V and VIN suddenly falls to −60V, VN14 in FIG. 5 would rapidly become 96V. Transistors M9-M11 comprise drain-extended PMOS transistors and, as such, are rated to relatively high Vds voltages, but the rating of Vds is less than 96V. In one example, the maximum Vds of transistors M9-M11 is 85V.

Figure 10:
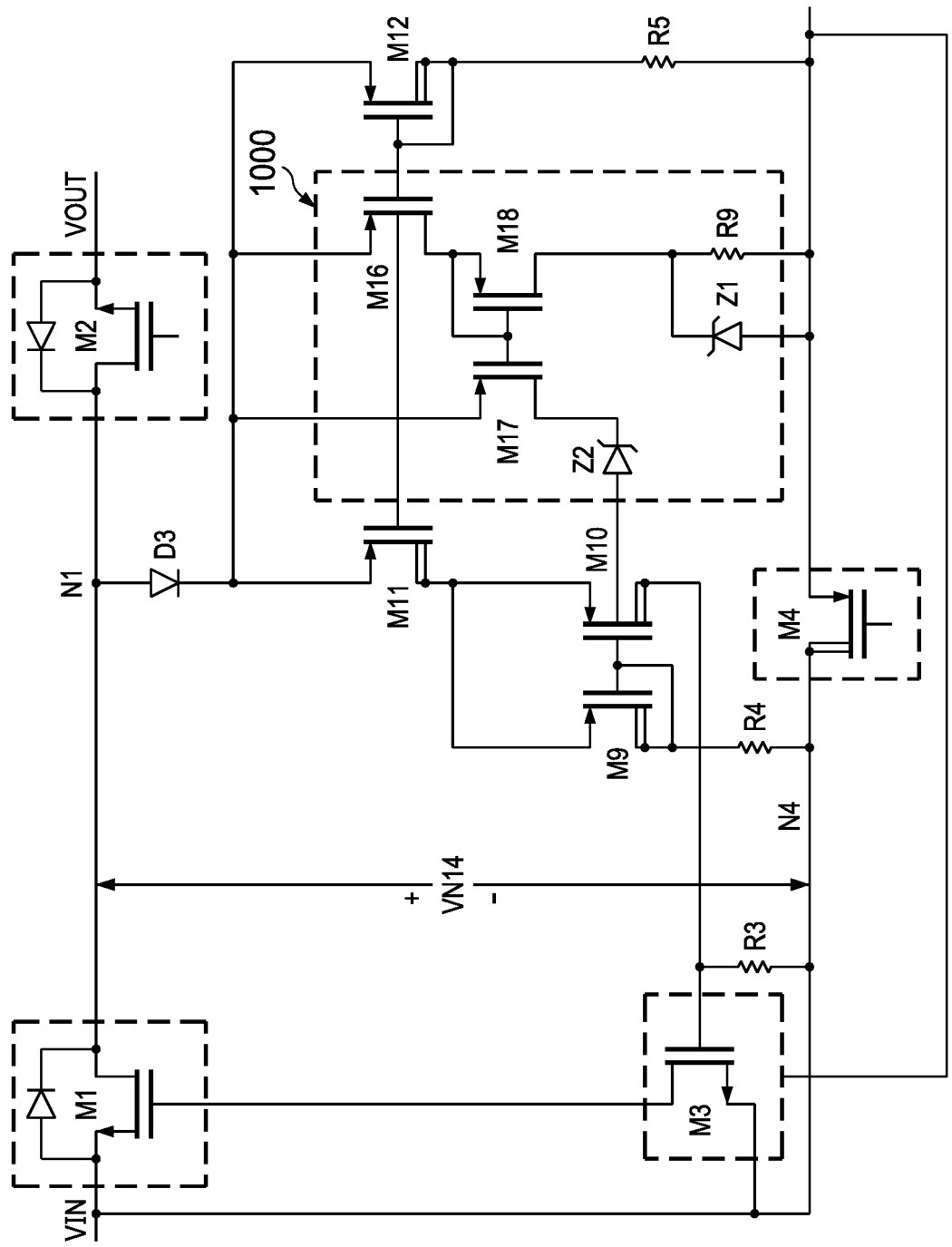
FIG. 10 illustrates how the drain-to-source voltage of transistors within the integrated circuit will be maintained under the maximum rating of the transistors.

FIG. 10 shows a modification to the negative voltage circuit 500 of FIG. 5 to ensure that the Vds of transistors M9-M11 do not exceed the maximum Vds rating of the transistors. The circuit example of FIG. 10 includes a voltage clamp circuit 1000 to control the gates of M9/M10 to distribute the VN14 voltage across M11 and M9/M10 so that M11 does not have a Vds larger than its rated value, and similarly neither M9 nor M10 have a Vds larger than their rated values.

Voltage clamp circuit 1000 includes transistors M16, M17, and M18, resistor R9, and Zener diodes Z1 and Z2. In this example, transistor M16 is a PMOS transistor, and transistors M17 and M18 are NMOS transistors. The source of transistor M16 is connected to the sources of transistors M11 and M12, and the drain of transistor M16 is connected to the drains and gates of transistors M17 and M18. The source of transistor M17 is connected to the anode of Zener diode Z2, and the anode of Zener diode Z2 is connected to the gates of transistors M9 and M10. The source of transistor M18 is connected to resistor R9 and to the cathode of Zener diode Z1. Zener diode Z1 is connected across resistor R9.

With VOUT being approximately 0V, the voltage on node N1 is approximately 0V. If VIN becomes increasingly negative, eventually VIN will be negative enough to turn on Zener diode Z1. Once Zener diode Z1 turns on, the voltage across resistor R9 is clamped at the breakdown voltage of the Zener diode. The gate voltage for transistors M17 and M18 will be approximately one threshold voltage (e.g., 1 V) above the breakdown voltage of the Zener diode Z1. A threshold voltage drop will be seen between the gate and source of transistor M17, and thus the voltage on the source of transistor M17 will be approximately equal to the voltage on the cathode of Zener diode Z1. Zener diode Z2 will be also be on, and thus the voltage on its anode will be approximately 0V due to breakdown voltage drop caused by Zener diode Z1. As such, the voltage on the gates of transistors M9 and M10 will be approximately 0V responsive to VIN becoming negative enough to turn on Zener diode Z1.

If the voltage on the gates of transistors M9 and M10 is approximately 0V, then the voltage drop between node N1 and the gates of transistors M9 and M10 will be VOUT. In one example, IC 100 is rated for a maximum VOUT of 36V, and thus at most VOUT (e.g., 36V) is dropped between the source and drain of transistor M11. The remaining voltage (VN14 minus the Vds of transistor M11) is thus dropped across transistors M9 and M10. In an example worst case scenario in which VN14 is 96V, the maximum voltage between the drains and sources of transistors M9 and M10 will be 60V, and thus within the maximum Vds rating (85V) of transistors M9 and M10. Advantageously, voltage clamp circuit 1000 clamps the voltage on the gate of transistor M10 to adequately distribute the VN14 voltage between nodes N1 and N4 so as not to damage transistors M9, M10, or M11.

Figure 11:
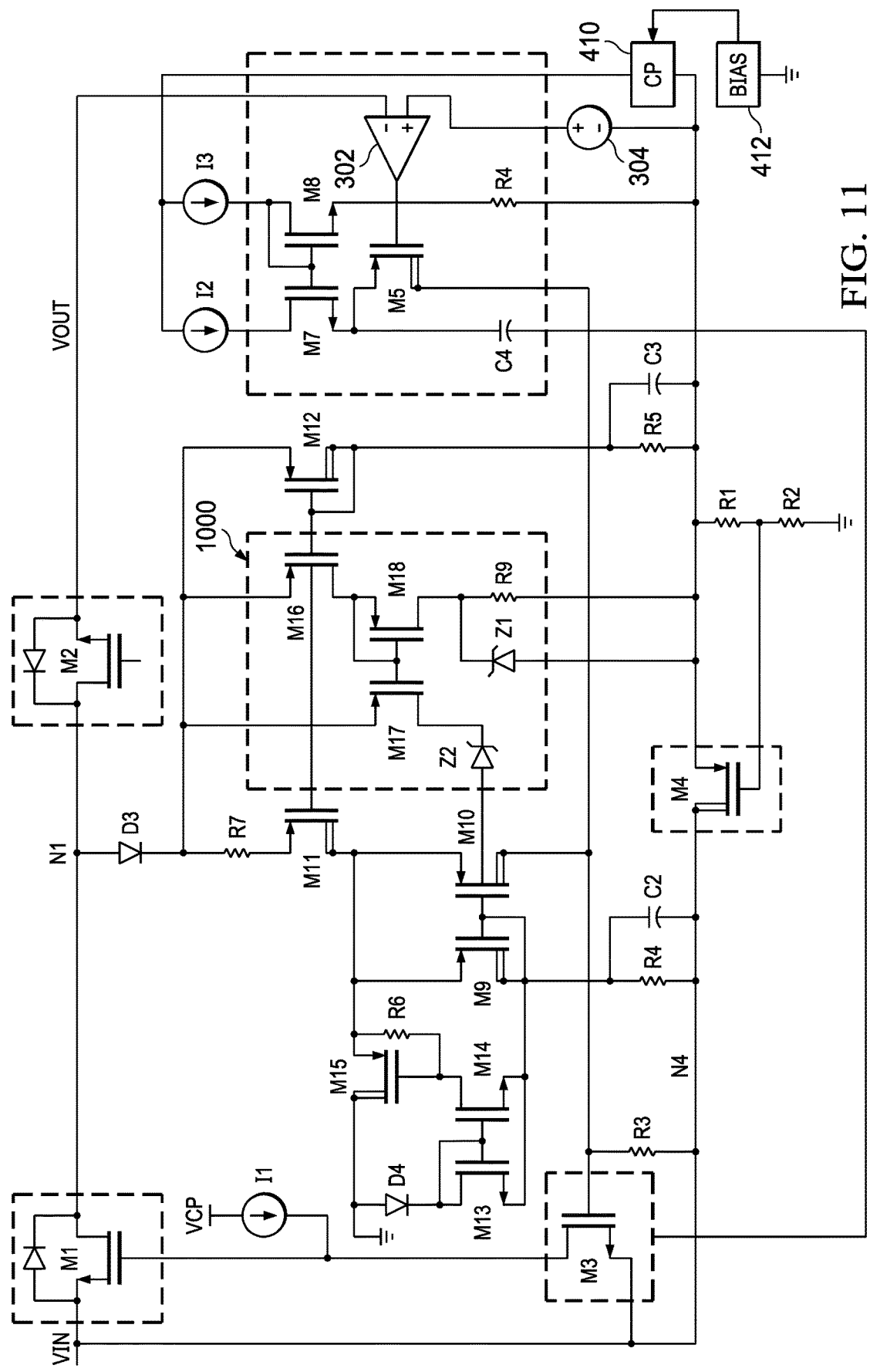
FIG. 11 shows a schematic of an example circuit including the components of FIG. 10.

FIG. 11 shows the circuit of FIG. 8 but including voltage clamp circuit 1000. As such, a description of the components shown in FIG. 11 is not repeated here.

Figure 12:
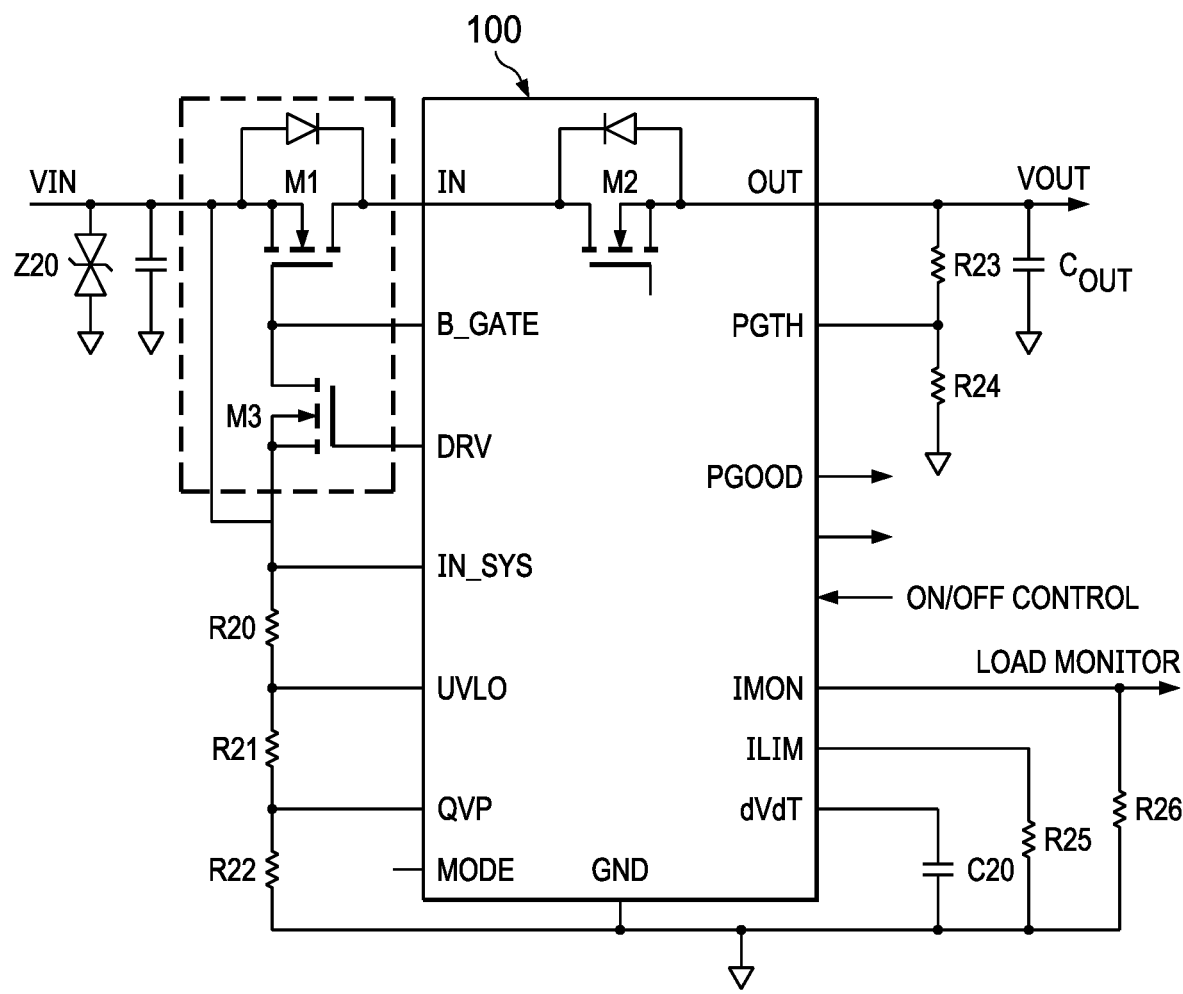
FIG. 12 shows an example of a system using the integrated circuit of FIG. 1.

FIG. 12 shows an example system 1200 in which the IC 100 can be used. Various external components to the IC 100 are shown including transistors M1 and M3 as well as resistors R20, R21, R22, R23, R24, R25, and R26, capacitor C20, and Zener diodes Z20. In this example, IC 100 includes transistor M2 and some or all of the components shown in the preceding schematics (except for transistors M1 and M3, which are not provided on the same die as IC 100). The drain of transistor M1 is connected to the input pin IN, and the VIN is connected directly to the input pint IN_SYS. The B_GATE pin is connected to the gate of transistor M1 and the drain of transistor M3. The UVLO input is used to set the programmable under-voltage lockout threshold. The OVP input is used to set the programmable overvoltage protection threshold. VOUT is taken from the output pin OUT. Resistors R23 and R24 form a voltage divider to divide down VOUT to provide a scaled version of VOUT to the PGTH input for the internal comparator 302 (FIG. 3). IMON is an output that provides a signal indicative of the current through M2. Resistor R25 between ILIM and ground sets the overload and short-circuit current limit. Capacitor C20 between dv/dv and ground sets the output voltage slew rate.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

What is claimed is:

1. A circuit, comprising:
   a first transistor having a first control input and first and second current terminals, the first current terminal coupled to an input voltage terminal;
   a second transistor having a second control input and third and fourth current terminals, the third current terminal connected to the second current terminal, and the fourth current terminal coupled to an output voltage terminal;
   a third transistor having a third control input and fifth and sixth current terminals, the fifth current terminal coupled to the first control input, and the sixth current terminal coupled to the first current terminal;
   a comparator having a comparator output and first and second comparator inputs, the first comparator input coupled to the fourth current terminal, the second comparator input configured to be biased at a voltage greater than an input voltage at the input voltage terminal, and the comparator output coupled to the third control input;
   a capacitor having first and second capacitor terminals;
   a current source device coupled between the second current terminal and the first capacitor terminal;
   a first resistor coupled between the third control input and the sixth current terminal; and
   a charge pump coupled between the second current terminal and the second capacitor terminal;
   in which the capacitor is configured to discharge through the first resistor, responsive to the comparator output indicating the input voltage is lower than the output voltage.

2. A circuit comprising:
   a first transistor having a first control input and first and second current terminals, the first current terminal coupled to an input voltage terminal;
   a second transistor having a second control input and third and fourth current terminals, the third current terminal connected to the second current terminal, and the fourth current terminal coupled to an output voltage terminal;
   a third transistor having a third control input and fifth and sixth current terminals, the fifth current terminal coupled to the first control input, and the sixth current terminal coupled to the first current terminal;
   a comparator having a comparator output and first and second comparator inputs, the first comparator input coupled to the fourth current terminal, the second comparator input configured to be biased at a voltage greater than an input voltage at the input voltage terminal, and the comparator output coupled to the third control input;
   a capacitor having first and second capacitor terminals;
   a current source device coupled between the second current terminal and the first capacitor terminal;
   a first resistor coupled between the third control input and the sixth current terminal;
   a current mirror coupled between the current source device and the first capacitor terminal; and
   a second resistor coupled between the current source device and the second capacitor terminal;
   in which the capacitor is configured to discharge through the first resistor, responsive to the comparator output indicating the input voltage is lower than the output voltage.

3. A circuit comprising:
   a first transistor having a first control input and first and second current terminals, the first current terminal coupled to an input voltage terminal;
   a second transistor having a second control input and third and fourth current terminals, the third current terminal connected to the second current terminal, and the fourth current terminal coupled to an output voltage terminal;
   a third transistor having a third control input and fifth and sixth current terminals, the fifth current terminal coupled to the first control input, and the sixth current terminal coupled to the first current terminal;
   a comparator having a comparator output and first and second comparator inputs, the first comparator input coupled to the fourth current terminal, the second comparator input configured to be biased at a voltage greater than an input voltage at the input voltage terminal, and the comparator output coupled to the third control input;
   a first current mirror coupled to the second current terminal;
   a second current mirror coupled between the first current mirror and the input voltage terminal;
   a first resistor coupled between the second current mirror and the input voltage terminal; and
   a second resistor coupled between the second current mirror and the input voltage terminal.

4. The circuit of claim 3, wherein a resistance of the first resistor is larger than a resistance of the second resistor.

5. The circuit of claim 3, further comprising a capacitor coupled in parallel with the first resistor.

6. The circuit of claim 3, further comprising:
   a third current mirror coupled to the second current terminal;
   a third resistor coupled to the third current mirror;
   a first voltage clamp device coupled in parallel with the third resistor; and
   a second voltage clamp device coupled to the second current mirror.

7. A circuit, comprising:
a first transistor having a first control input and first and second current terminals, the first current terminal coupled to an input voltage terminal;
a second transistor having a second control input and third and fourth current terminals, the third current terminal coupled to the second current terminal, and the fourth current terminal coupled to an output voltage terminal;
a third transistor having a third control input and fifth and sixth current terminals, the fifth current terminal coupled to the first control input, and the sixth current terminal coupled to the first current terminal; and
a first current mirror coupled to the second current terminal; and
a second current mirror coupled between the first current mirror and the input voltage terminal;
a first resistor coupled between the second current mirror and the input voltage terminal; and
a second resistor coupled between the second current mirror and the input voltage terminal.

8. The circuit of claim 7, further comprising a comparator having a comparator output and first and second comparator inputs, the first comparator input coupled to the output voltage terminal, the second comparator input configured to be biased at a voltage greater than an input voltage at the input voltage terminal, and the comparator output configured to control a power state of the third transistor.

9. The circuit of claim 8, further comprising:
a capacitor having first and second capacitor terminals;
a current source device coupled between the second current terminal and the first capacitor terminal; and
a third resistor coupled between the third control input and the sixth current terminal;
in which the capacitor is configured to discharge through the first resistor, responsive to the comparator output indicating the input voltage is lower than the output voltage.

10. The circuit of claim 9, further comprising:
a third current mirror coupled between the current source device and the first capacitor terminal; and
a fourth resistor coupled between the current source device and the second capacitor terminal.

11. The circuit of claim 10, further comprising a Zener diode coupled in parallel with the fourth resistor.

12. The circuit of claim 7, further comprising a capacitor coupled in parallel with the first resistor.

13. A system, comprising:
a first transistor having a first control input and first and second current terminals, the first current terminal coupled to an input voltage terminal;
a second transistor having a second control input and third and fourth current terminals, the third current terminal coupled to the second current terminal, and the fourth current terminal coupled to an output voltage terminal; and
a drive circuit coupled to the first control input, the second control input and the second current terminal, the drive circuit configured to:
charge a capacitor maintain the first transistor in an off state responsive to a negative voltage at the input voltage terminal; and
responsive to a negative voltage at the input voltage terminal, cause the charge from the capacitor to be used to turn off the first transistor; and
a load coupled to the output voltage terminal.

14. The system of claim 13, wherein the drive circuit includes a bias generator configured to produce a biased input voltage equal to the input voltage plus a bias voltage, and a comparator configured to compare an output voltage at the output voltage terminal to a biased input voltage.

15. The system of claim 14, wherein the comparator has a comparator output, and the system further comprises a third transistor configured to turn on responsive to the comparator output indicating the output voltage is greater than the biased input voltage.

16. The system of claim 13, wherein, without a positive input voltage having been provided to the input voltage terminal, the drive circuit is configured to maintain the first transistor in an off state.

17. The system of claim 13, wherein the drive circuit includes a charge pump configured to produce a voltage to charge the capacitor.

18. The system of claim 13, wherein the first transistor is provided on a separate die from the second transistor.

* * * * *